United States Patent
Chung et al.

(12) 
(10) Patent No.: US 6,878,467 B2
(45) Date of Patent: Apr. 12, 2005

(54) ORGANIC ELECTRO-LUMINESCENCE ELEMENT USED IN A DISPLAY DEVICE

(75) Inventors: Chia-Tin Chung, Miaoli Hsien (TW); Chen-Ze Hu, Chung-Ho (TW); Andrea Hwang, Changhua (TW); Chen-Wei Huang, Tainan Hsien (TW)

(73) Assignees: Chi Mei Optoelectronics Corporation, Tainan (TW); Kyocera Corporation, Kyoto (JP)

( * ) Notice: Subject to any disclaimer, the term of this patent is extended or adjusted under 35 U.S.C. 154(b) by 38 days.

(21) Appl. No.: 09/970,068

(22) Filed: Oct. 2, 2001

(65) Prior Publication Data

US 2002/0146533 A1 Oct. 10, 2002

(30) Foreign Application Priority Data

Apr. 10, 2001  (TW) .......................................... 90108558 A

(51) Int. Cl.$^7$ .............................................. H05B 33/04
(52) U.S. Cl. ......................... 428/690; 428/76; 428/917; 313/504; 313/506; 313/512; 257/100
(58) Field of Search .......................... 428/76, 690, 917; 313/504, 506, 512; 257/100

(56) References Cited

U.S. PATENT DOCUMENTS

| | | | | |
|---|---|---|---|---|
| 5,189,405 A | * | 2/1993 | Yamashita et al. | 340/781 |
| 5,882,761 A | | 3/1999 | Kawami et al. | 428/69 |
| 6,081,071 A | * | 6/2000 | Rogers | 313/512 |
| 6,284,342 B1 | * | 9/2001 | Ebisawa et al. | 428/69 |
| 6,383,664 B1 | * | 5/2002 | Bernius et al. | 428/690 |
| 6,489,719 B1 | * | 12/2002 | Young et al. | 313/512 |
| 6,624,570 B1 | * | 9/2003 | Nishio et al. | 313/506 |
| 2001/0046579 A1 | * | 11/2001 | Ishii et al. | 428/68 |
| 2002/0125817 A1 | * | 9/2002 | Yamazaki et al. | 313/498 |

FOREIGN PATENT DOCUMENTS

| | | | |
|---|---|---|---|
| EP | 1021070 A1 | * | 7/2000 |
| JP | 06-176867 | * | 6/1994 |

* cited by examiner

*Primary Examiner*—Dawn Garrett
(74) *Attorney, Agent, or Firm*—Merchant & Gould P.C.

(57) ABSTRACT

An organic electro-luminescence (EL) element used for a display device has a glass substrate having a luminescent device on the inner surface, a drying layer formed on the rim of the inner surface of the glass substrate, a sealing layer formed on the rim of the inner surface of the glass substrate and surrounding the drying layer, and a sealing case bonded to the rim of the glass substrate to form an airtight space.

21 Claims, 2 Drawing Sheets

ORGANIC ELECTRO-LUMINESCENCE ELEMENT USED IN A DISPLAY DEVICE

BACKGROUND OF THE INVENTION

1. Field of the Invention

The present invention relates to an organic electro-luminescence (EL) element used in a display device and, more particularly, to a method of packaging an organic EL element used in a display device.

2. Description of the Related Art

In an electro-luminescence (EL) element used for a display device, electric current applied to specific fluorescence or phosphorus can transform electricity into luminosity. According to the different materials used in the luminescent layer, EL elements are classified as organic and inorganic, wherein the organic EL element employs laminated organic layers and has the advantages of thin profile, light weight, high luminescent efficiency, and low driving voltage. However, as the duration of use increases, the probability of moisture and oxygen permeating the organic EL element also increases, causing detachment between the organic luminescent layer and the cathode electrode, cracking of the organic materials, and oxidation of the electrodes. As a result, a so-called 'dark spot', to which electricity is not supplied, is generated, decreasing luminescence and luminescent uniformity.

In order to prevent the internal space of the organic EL element from developing a high humidity condition, a sealing case is commonly used to package the glass substrate on which metal electrodes and the organic luminescent layer are completed. Also, in order to prolong the active lifetime, a desiccant is installed to absorb the moisture and impurities generated in the interior space, the water and oxygen permeating from the atmosphere, and the moisture generated from the outgassing caused by the bonding agent on the rim of the sealing case. Furthermore, various technologies of reducing the interior humidity, to solve the problem of the dark spot, are developed, such as forming photo-hardened resin on the glass substrate, plating metal oxide, fluoride or sulfide on the glass substrate, forming a water-resistance film on the glass substrate, and using an airtight case to package the organic EL element. Nevertheless, other problems, such as leakage current, crosstalk and oxide dissolution, are found to be solved.

As shown in FIG. 1, U.S. Pat. No. 5,882,761 discloses an organic EL element 10, which comprises a glass substrate 12, a sealing agent 14 of UV-curing resin formed on the rim of the glass substrate 12, and a sealing case 16 bonded to the glass substrate 12 by the sealing agent 14. Thus, the internal space formed by the glass substrate 12 and the sealing case 16 becomes an airtight container. Also, in the airtight container, the glass substrate 12 comprises a lamination body 20 that is formed by a cathode layer 26, an organic luminescent material layer 24 and an anode layer 22. Furthermore, a drying substance 28 is disposed on the bottom of the sealing case 16 and spaced from the lamination body 20 by an internal space 18 that is filled with dried inert gas. The drying substance 28 comprises a solid compound, such as BaO, CaO, $CaSO_4$, and $CaCl_2$, which chemically absorbs moisture and maintains its solid state.

However, the UV-curing resin used in the sealing agent 14 is epoxy resin that has good adhesion but poor resistance to moisture in the internal space 18 caused by outgassing of the sealing agent 14 and the permeation of water and oxygen from the atmosphere. This may compromise the luminescent properties of the organic EL element 10. Seeking to solve the above-mentioned problem, one method is to develop a new material for the sealing agent 14 to achieve good adhesion and good water/oxygen-resistance ability. Yet, in consideration of the thermal expansion coefficient match, the glass transition temperature and the contact angle, adequate material has yet to be developed for the sealing agent 14. The other method is to add a large number of BaO or CaO to the drying substance 28 to increase the moisture absorbency. Unfortunately, the moisture absorbency is limited when the thickness of the drying substance 28 exceeds a critical value. Thus, a new method of packaging the organic EL element solving the aforementioned problems is called for.

SUMMARY OF THE INVENTION

The present invention provides an organic EL element used for a display device with adequate packaging method to solve the problems in the prior art.

The organic electro-luminescence (EL) element used for a display device has a glass substrate having a luminescent device on the inner surface, a drying layer formed on the rim of the inner surface of the glass substrate, a sealing layer formed on the rim of the inner surface of the glass substrate and surrounding the drying layer, and a sealing case bonded to the rim of the glass substrate to form an airtight space.

The drying layer comprises an adhesion agent and composite materials with absorption of moisture, oxygen and impurities, wherein the adhesion agent is UV-curing resin and the composite material is inorganic absorption material or organic absorption material. Preferably, the composite material comprises silicon, $Al_2O_3$, CaO and $SiO_2$.

In the other embodiment, the sealing case comprises a trench on the bottom of the inner wall and in position to the luminescent device, a hydrophobic layer in the bottom of the trench, an adhesion layer formed on the rim of the opening of the trench; and a semi-permeable film with moisture permeability without water permeability covering the opening of the trench and bonded by the adhesion layer. The adhesion layer comprises an adhesion agent and composite materials with absorption of moisture, oxygen and impurities.

Accordingly, it is a object of the invention to omit the desiccant used in the prior art.

It is another object of the invention to provide the sealing layer and the drying layer in the same step, to simplify the packaging process.

Yet another object of the invention is to provide a drying layer that has adhesion, resistance to moisture and oxygen permeated from the atmosphere, the absorption of impurities and solvents generated in the airtight space, and prevention of the outgassing problem caused by the resin material.

It is a further object of the invention to provide a sealing layer and drying layer achieving the aims of good adhesion and good resistance to moisture/oxygen.

Still another object of the invention is to provide a semi-permeable film to stop the water droplets remaining in the trench from permeating the airtight space of the organic EL element.

Another object of the invention is to share the absorption of the moisture between the drying layer and the specific sealing case, thereby increasing the active lifetime of the drying layer.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

[First Embodiment]

Figure 1:
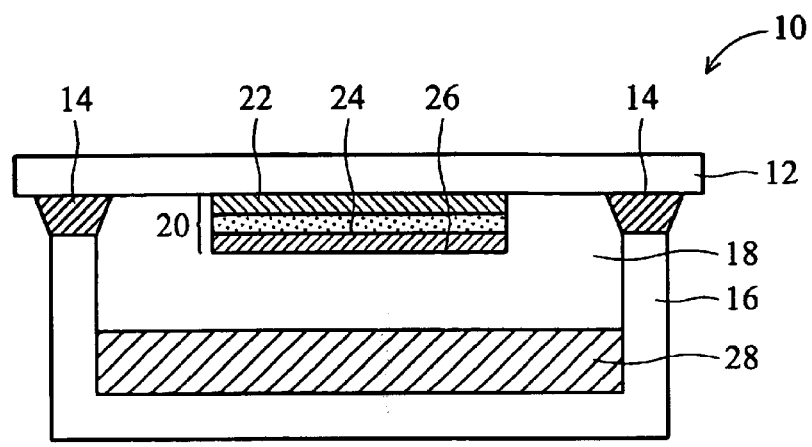
FIG. 1 is a schematic diagram showing an organic EL element according to the prior art.
Figure 2:
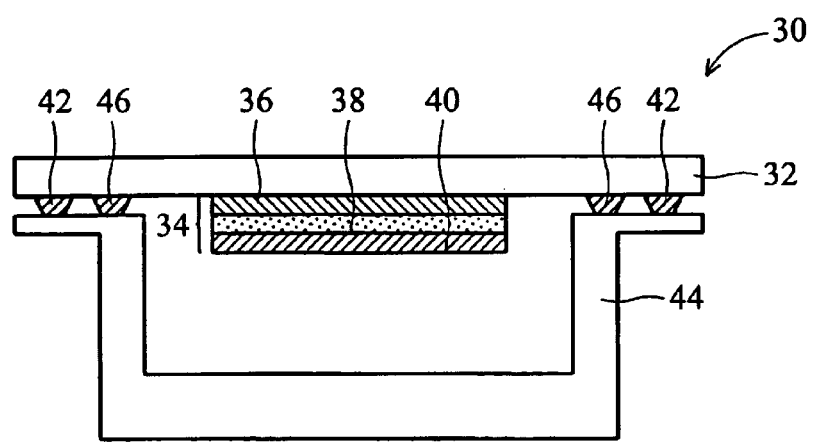
FIG. 2 is a schematic cross-section showing an organic EL element used for a display device according to the first embodiment of the present invention.

FIG. 2 is a schematic cross-section showing an organic EL element 30 used for a display device according to the first embodiment of the present invention. The organic EL element 30 comprises a glass substrate 32, and a luminescent device 34 formed on the inner surface of the glass substrate 32. The luminescent device 34 is a lamination body formed by an anode layer 36, an organic luminescent material layer 38, and a cathode layer 40, wherein the anode layer 36 is preferably of a transparent conductive material, such as indium tin oxide (ITO). In another embodiment, a hole-transporting layer and an electron-transporting layer can be formed in the luminescent device 34.

A sealing layer 42 is formed on the rim of the inner surface of the glass substrate 32 to form a first closed loop for providing most of the necessary adhesion during packaging. A sealing case 44, of a metal plate, a glass plate, or a laminated-layers plate (such as a lamination of polymer/Al/polymer/silicon oxide), is bonded to the glass substrate 32 by the sealing layer 42 so as to form an airtight space. In addition, a drying layer 46 is formed on the rim of the inner surface of the glass substrate 32 and surrounded by the sealing layer 42 to form a second closed loop for resisting/absorbing the permeation of water and oxygen and providing part of the adhesion during packaging.

The sealing layer 42 is UV-hardened resin and has good adhesion to metal or glass, thus providing good adhesion between the glass substrate 32 and the sealing case 44. The drying layer 46 is composed of UV-hardened resin with adhesion and composite materials with absorption of moisture, oxygen, impurities and solvents, such as mono polymer, copolymer, semi-IPN, or IPN. Preferably, the composite material comprises silicon, $Al_2O_3$, CaO, and $SiO_2$.

In packaging the organic EL element 30, when the luminescent device 34 is completed on the inner surface of the glass substrate 32, the sealing layer 42 and the drying layer 46 are respectively formed as the first closed loop and the second closed loop on the rim of the glass substrate 32 by dispensing, printing or any other deposition methods. In another case, the sealing layer 42 and the drying layer 46 are respectively formed as the first closed loop and the second closed loop on the rim of the sealing case 44. Then, using bonding technique, the sealing case 44 and the glass substrate 32 are bonded to form an airtight space.

Compared with the organic EL element in the prior art, in the organic EL element 30 of the first embodiment of the present invention, the sealing layer 42 and the drying layer 46 can be formed at the same step and the desiccant used in the prior art is omitted, thus simplifying the packaging procedure. Also, the drying layer 46 not only provides adhesion, but also provides the resistance to moisture and oxygen permeated from the atmosphere, the absorption of impurities and solvents generated in the airtight space, and the prevention of the outgassing problem caused by the resin material. Therefore, without the drying substance, the combination of the sealing layer 42 and the drying layer 46 can achieve the aims of good adhesion and good resistance to moisture/oxygen.

[Second Embodiment]

Figure 3:
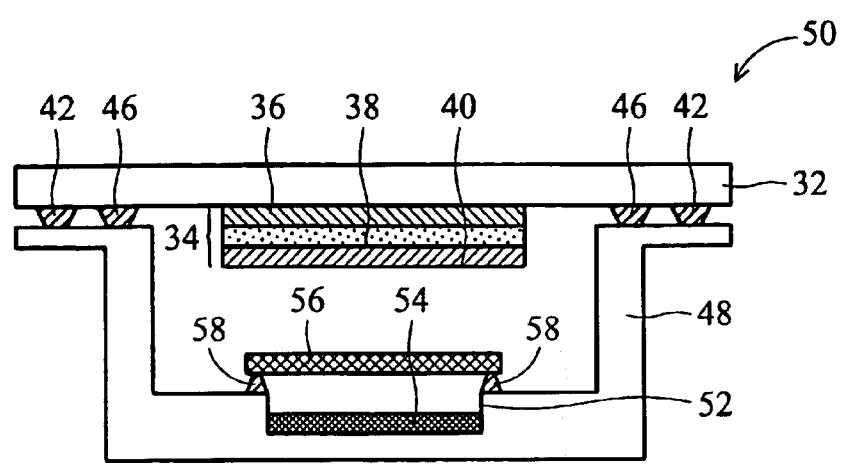
FIG. 3 is a schematic cross-section showing an organic EL element used for a display device according to the second embodiment of the present invention.

FIG. 3 is a schematic cross-section showing an organic EL element 50 used for a display device according to the second embodiment of the present invention. In order to further increase the active lifetime of the organic EL element 30 in the first embodiment, the sealing case 44 is improved as a specific sealing case 48 in the organic EL element 50 of the second embodiment to strongly resist the moisture. The specific sealing case 48 comprises a trench 52 on the bottom of the inner wall and in position to the luminescent device 34, a hydrophobic layer 54 disposed in the bottom of the trench 52, and a semi-permeable film 56 covering the opening of the trench 52 and bonded by an adhesion layer 58 formed on the rim of the opening.

The semi-permeable film 56 has moisture permeability, but not water permeability. Accordingly, the moisture generated in the airtight space can pass through the semi-permeable film 56 to reach the trench 52, and then the moisture easily condenses into water droplets caused by the hydrophobic layer 54. Thereafter, since the semi-permeable film 56 is waterproof, the water droplets remain in the trench 52 to stop them from permeating into the airtight space of the organic EL element 50. Thus, the moisture is shared between the drying layer 46 and the specific sealing case 48 to increase the active lifetime of the drying layer 46.

Additionally, the adhesion layer 58 can employ the same materials used in the drying layer 46, such as UV-hardened resin, silicon, $Al_2O_3$, CaO and $SiO_2$, to provide adhesion, resistance to moisture and oxygen permeated from the atmosphere, absorption of impurities and solvents generated in the airtight space, and prevention of the outgassing problem caused by the resin material. This further increases the active lifetime of the organic EL element 50.

It is to be understood that the present invention is not limited to the embodiments described above, but encompasses any and all embodiments within the scope of the following claims.

What is claimed is:

1. An organic electro-luminescence (EL) element comprising:
    a glass substrate having a luminescent device on an inner surface;
    a drying layer adhered to a rim of the inner surface of the glass substrate without contact with the luminescent device, wherein the drying layer includes UV-curing resin;
    a sealing layer formed on the rim of the inner surface of the glass substrate and surrounding the drying layer; and
    a sealing case bonded to the rim of the glass substrate to form an airtight space.

2. The organic EL element according to claim 1, wherein the drying layer includes a composite material which is inorganic material or organic material.

3. The organic EL element according to claim 2, wherein the composite material comprises silicon, $Al_2O_3$, CaO or $SiO_2$.

4. The organic EL element according to claim 1, wherein the drying layer comprises an adhesion agent and a composite material with adsorption of moisture, oxygen or impurities.

5. The organic EL element according to claim 1, wherein the sealing case is bonded only to the rim of the inner surface of the glass substrate to form an airtight space.

6. An organic EL element comprising:
- a glass substrate having a luminescent device on an inner surface;
- a drying layer formed on a rim of the inner surface of the glass substrate;
- a sealing layer formed on the rim of the inner surface of the glass substrate and surrounding the drying layer; and
- a sealing case bonded to the rim of the glass substrate to form an airtight space, wherein the sealing case includes:
- an inner wall exposed to the airtight space;
- a trench on the inner wall;
- a hydrophobic layer in the bottom of the trench;
- an adhesion layer formed on the rim of the opening of the trench; and
- a semi-permeable film with moisture permeability without water permeability covering the opening of the trench and bonded by the adhesion layer.

7. The organic EL element according to claim 6, wherein the adhesion layer comprises an adhesion agent and a composite material with absorption of moisture, oxygen or impurities.

8. The organic EL element according to claim 7, wherein the adhesion agent is UV-curing resin.

9. The organic EL element according to claim 7, wherein the composite material is inorganic material or organic material.

10. The organic EL element according to claim 7, wherein the composite material comprises silicon, $Al_2O_3$, CaO or $SiO_2$.

11. The organic EL element according to claim 6, wherein the luminescent device is a lamination body formed by at least a cathode layer, an organic luminescent material layer and an anode layer.

12. An organic electro-luminescence (EL) element comprising:
- a glass substrate having a luminescent device on an inner surface;
- a loop of drying layer formed only on a rim of the inner surface of the glass substrate without contact with the luminescent device, in which the drying layer comprises an adhesion agent and a composite material with adsorption of moisture, oxygen or impurities, where in the adhesion agent is UV-curing resin;
- a sealing layer formed on the rim of the inner surface of the glass substrate and surrounding the drying layer; and
- a sealing case bonded to the rim of the glass substrate to form an airtight space.

13. The organic EL element according to claim 12, wherein the composite material is inorganic material or organic material.

14. The organic EL element according to claim 12, wherein the composite material comprises silicon, $Al_2O_3$, CaO or $SiO_2$.

15. The organic EL element according to claim 12, wherein the luminescent device is a lamination body formed by at least a cathode layer, an organic luminescent material layer and an anode layer.

16. The organic EL element according to claim 12, wherein the sealing case is bonded only to the rim of the inner surface of the glass substrate to form an airtight space.

17. An organic electro-luminescence (EL) element comprising:
- a first substrate having a luminescent device on an inner surface;
- a loop of drying layer adhered to a rim of the inner surface of the first substrate, wherein the drying layer includes UV-curing resin;
- a loop of sealing layer formed on the inner surface of the first substrate and surrounding the drying layer; and
- a sealing substrate bounded to the rim of the first substrate to form an airtight space.

18. The organic EL element according to claim 17, wherein the drying layer comprises an adhesion agent and a composite material with adsorption of moisture, oxygen or impurities.

19. The organic EL element according to claim 18, wherein the composite material comprises silicon, $Al_2O_3$, CaO or $SiO_2$.

20. The organic EL element according to claim 17, wherein the drying layer includes a composite material which is inorganic material or organic material.

21. The organic EL element according to claim 17, wherein the sealing substrate is bonded by the loop of drying layer and sealing layer to form an airtight space.

* * * * *